United States Patent
Lee et al.

(10) Patent No.: US 11,527,713 B2
(45) Date of Patent: Dec. 13, 2022

(54) TOP ELECTRODE VIA WITH LOW CONTACT RESISTANCE

(71) Applicant: Taiwan Semiconductor Manufacturing Co., Ltd., Hsin-Chu (TW)

(72) Inventors: Bi-Shen Lee, Hsin-Chu (TW); Hai-Dang Trinh, Hsinchu (TW); Hsun-Chung Kuang, Hsinchu (TW); Tzu-Chung Tsai, Hsinchu County (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/921,133

(22) Filed: Jul. 6, 2020

(65) Prior Publication Data

US 2021/0242399 A1 Aug. 5, 2021

Related U.S. Application Data

(60) Provisional application No. 62/968,333, filed on Jan. 31, 2020.

(51) Int. Cl.
*H01L 45/00* (2006.01)
(52) U.S. Cl.
CPC ........ *H01L 45/1253* (2013.01); *H01L 45/145* (2013.01); *H01L 45/1675* (2013.01)
(58) Field of Classification Search
CPC ................... H01L 45/1233; H01L 45/1253
See application file for complete search history.

(56) References Cited

U.S. PATENT DOCUMENTS

| | | | |
|---|---|---|---|
| 6,849,891 B1 | 2/2005 | Hsu et al. | |
| 9,728,719 B2 * | 8/2017 | Liu | ...................... H01L 45/1246 |
| 2013/0217179 A1 | 8/2013 | Wang et al. | |
| 2015/0340611 A1 | 11/2015 | Akhtar et al. | |
| 2016/0020390 A1 | 1/2016 | Chang et al. | |
| 2016/0111638 A1 | 4/2016 | Banno et al. | |
| 2018/0375024 A1 | 12/2018 | Chu et al. | |
| 2019/0044065 A1 | 2/2019 | Tseng et al. | |
| 2021/0242399 A1 * | 8/2021 | Lee | ........................ H01L 27/228 |

FOREIGN PATENT DOCUMENTS

DE 102018100023 A1 2/2019

OTHER PUBLICATIONS

Shamiryan et al. "Selective Removal of High-k Gate Dielectrics" Chem. Eng. Comm., 196:1475-1535, 2009, published on Sep. 7, 2009.

* cited by examiner

*Primary Examiner* — Mark V Prenty
(74) *Attorney, Agent, or Firm* — Eschweiler & Potashnik, LLC

(57) ABSTRACT

The present disclosure, in some embodiments, relates to a memory device. The memory device includes a bottom electrode disposed over a lower interconnect within a lower inter-level dielectric (ILD) layer over a substrate. A data storage structure is over the bottom electrode. A first top electrode layer is disposed over the data storage structure, and a second top electrode layer is on the first top electrode layer. The second top electrode layer is less susceptible to oxidation than the first top electrode layer. A top electrode via is over and electrically coupled to the second top electrode layer.

20 Claims, 10 Drawing Sheets

TOP ELECTRODE VIA WITH LOW CONTACT RESISTANCE

REFERENCE TO RELATED APPLICATION

This Application claims the benefit of U.S. Provisional Application No. 62/968,333, filed on Jan. 31, 2020, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory (RRAM) devices are one promising candidate for a next generation non-volatile memory technology. This is because RRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
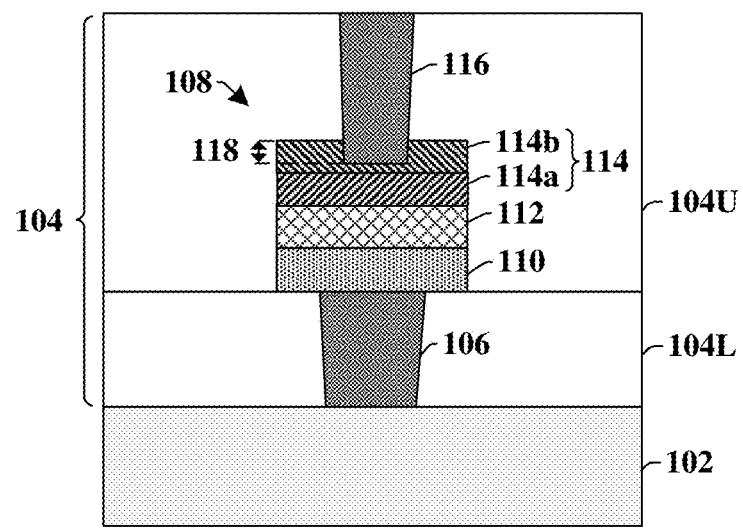
FIG. 1 illustrates a cross-sectional view of some embodiments of an integrated chip having a memory device comprising a multi-layer top electrode configured to mitigate oxide formation during fabrication.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are often formed within an inter-level dielectric (ILD) layer on a back-end-of-the line (BEOL) of an integrated chip. Such RRAM devices typically comprise a data storage structure disposed between a bottom electrode and a top electrode. The bottom electrode may be coupled to an underlying interconnect, while the top electrode may be coupled to an overlying interconnect by way of a top electrode via. The top electrode may be formed by depositing and patterning a conductive material over the data storage structure. After patterning, the top electrode is covered by an upper inter-level dielectric (ILD) layer, which is subsequently etched to define a top electrode via hole that exposes an upper surface of the top electrode. The top electrode via hole is filled with a conductive material to define the top electrode via.

However, between forming the top electrode via hole and filling the top electrode via hole within the conductive material, the upper surface of the top electrode may be exposed to an ambient environment (e.g., air). The ambient environment may cause an oxide to form along the exposed upper surface of the top electrode. When a top electrode via is subsequently formed, the oxide separates the top electrode from the top electrode via. Because the oxide may have a relatively large thickness (e.g., greater than or equal to approximately 20 Angstroms) it increases a resistance between the top electrode and the top electrode via. The increased resistance may result in poor performance of an associated RRAM device.

Furthermore, due to process tolerances, the increase in resistance between the top electrode and the top electrode via may be worse along outer edges of a wafer. For example, process tolerances may cause an oxide to form to a greater thickness along an outer edge of a wafer within a central region of a wafer. The difference in oxide thicknesses causes RRAM devices along the outer edge of a wafer to have a resistance between a top electrode and a top electrode via that is between approximately 30% and 40% higher than RRAM devices within the central region of a wafer. The difference in resistances may aggravate the poor performance of RRAM devices and/or lead to additional difficulties in reading and/or writing data to an RRAM array.

The present disclosure, in some embodiments, relates to a memory device (e.g., an RRAM device) having a multi-layer top electrode that is configured to mitigate formation of an oxide between the multi-layer top electrode and an overlying top electrode via. The memory device comprises a data storage structure disposed between a bottom electrode and a multi-layer top electrode. The multi-layer top electrode comprises a first top electrode layer having a first corrosion potential and an overlying second top electrode layer having a second corrosion potential that is higher than the first corrosion potential. A top electrode via is disposed on the second top electrode layer. Because the second corrosion potential is higher than the first corrosion potential, the second top electrode layer is able to mitigate the formation of an oxide between the multi-layer top electrode and the top electrode via. By mitigating the formation of an oxide between the multi-layer top electrode and the top electrode via, a resistance between the multi-layer top electrode and the top electrode via can be reduced and performance of the memory device can be improved.

FIG. 1 illustrates a cross-sectional view of some embodiments of an integrated chip 100 having a memory device comprising a multi-layer top electrode configured to mitigate oxide formation.

The integrated chip 100 comprises a memory device 108 disposed within a dielectric structure 104 over a substrate 102. The dielectric structure 104 comprises a plurality of stacked inter-level dielectric (ILD) layers. In some embodiments, the plurality of stacked ILD layers may comprise one or more lower ILD layers 104L arranged between the memory device 108 and the substrate 102, and an upper ILD layer 104U surrounding the memory device 108. In some embodiments, the one or more lower ILD layers 104L surround a lower interconnect 106 arranged below the memory device 108.

The memory device 108 comprises a bottom electrode 110, a data storage structure 112 arranged over the bottom electrode 110, and a multi-layer top electrode 114 arranged over the data storage structure 112. The multi-layer top electrode 114 comprises a first top electrode layer 114a and a second top electrode layer 114b over the first top electrode layer 114a. The first top electrode layer 114a comprises a different material than the second top electrode layer 114b. The first top electrode layer 114a separates the second top electrode layer 114b from the data storage structure 112. In some embodiments, the second top electrode layer 114b completely covers a top surface of the first top electrode layer 114a.

A top electrode via 116 extends through the upper ILD layer 104U to contact the multi-layer top electrode 114. The first top electrode layer 114a is separated from a bottom of the top electrode via 116 by the second top electrode layer 114b. In some embodiments, the top electrode via 116 extends to a non-zero distance 118 below a top of the multi-layer top electrode 114, so that the bottom of the top electrode via 116 is embedded within the multi-layer top electrode 114. In some such embodiments, the second top electrode layer 114b has a first non-zero thickness directly below the top electrode via 116 and a second thickness outside of the top electrode via 116, which is larger than the first non-zero thickness.

The second top electrode layer 114b is less susceptible to oxidation than the first top electrode layer 114a. Because the second top electrode layer 114b is less susceptible to oxidation than the first top electrode layer 114a, formation of an oxide along an upper surface of the multi-layer top electrode 114 (e.g., between the top electrode via 116 and the multi-layer top electrode 114) during fabrication of the memory device 108 is mitigated. By mitigating the formation of an oxide along an upper surface of the multi-layer top electrode 114, a resistance between the top electrode via 116 and the multi-layer top electrode 114 is reduced. For example, a resistance between the top electrode via 116 and the multi-layer top electrode 114 can be reduced by between approximately 50% and approximately 100% (e.g., from approximately 200 Ohms/sq to approximately 50 Ohms/sq) in comparison to memory devices not having a multi-layer top electrode.

Figure 2:
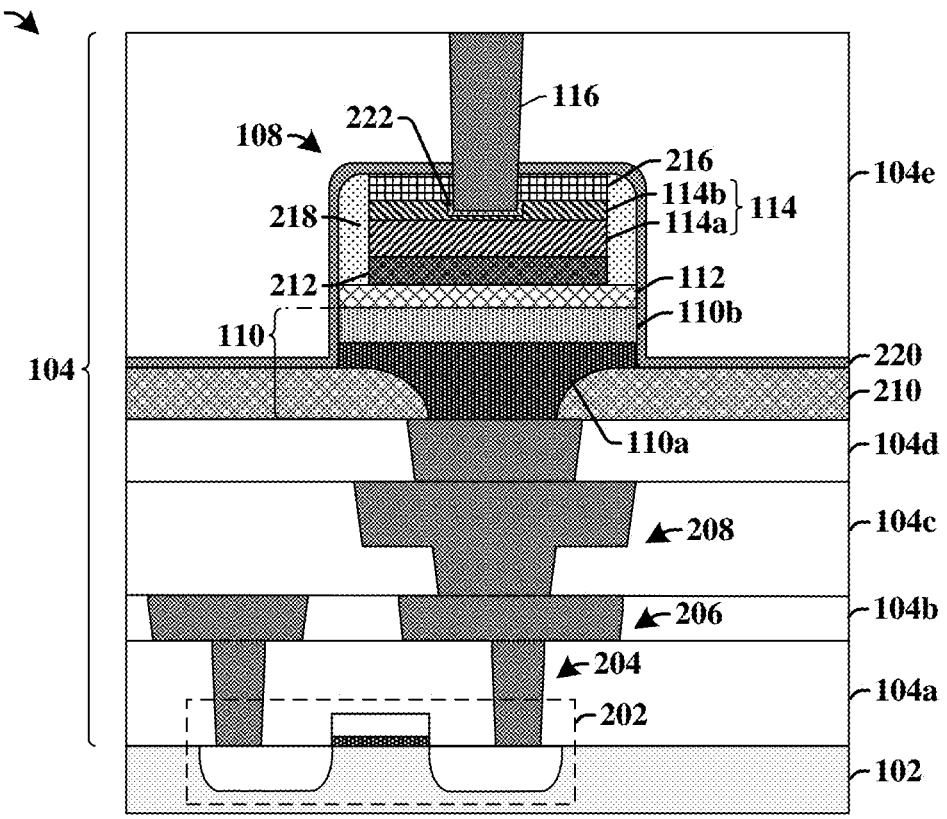
FIG. 2 illustrates a cross-sectional view of some additional embodiments of an integrated chip having a memory device comprising a multi-layer top electrode configured to mitigate oxide formation during fabrication.

FIG. 2 illustrates a cross-sectional view of some additional embodiments of an integrated chip 200 having a memory device comprising a multi-layer top electrode configured to mitigate oxide formation during fabrication.

The integrated chip 200 comprises a memory device 108 disposed within a dielectric structure 104 arranged over a substrate 102. In some embodiments, the dielectric structure 104 comprises a plurality of stacked inter-level dielectric (ILD) layers 104a-104e. The plurality of stacked ILD layers 104a-104e comprise one or more lower ILD layers 104a-104d that laterally surround one or more lower interconnect layers configured to couple the memory device 108 to an access device 202 arranged within the substrate 102. In some embodiments, the one or more lower interconnect layers may comprise conductive contacts 204, interconnect wires 206, and interconnect vias 208. In some embodiments, the access device 202 may comprise a transistor device (e.g., a MOSFET device, a BJT, or the like).

In some embodiments, a lower insulating structure 210 is disposed over the one or more lower ILD layers 104a-104d. The lower insulating structure 210 comprises sidewalls that define an opening extending through the lower insulating structure 210. In various embodiments, the lower insulating structure 210 may comprise one or more of silicon nitride, silicon dioxide, silicon carbide, or the like. In some embodiments, an upper insulating structure 220 is disposed over the memory device 108 and on the lower insulating structure 210. The upper insulating structure 220 continuously extends from a first position directly over the memory device 108 to a second position abutting an upper surface of the lower insulating structure 210. The upper insulating structure 220 separates the memory device 108 from an upper ILD layer 104e. In some embodiments, the upper insulating structure 220 may comprise one or more of silicon nitride, silicon dioxide, silicon carbide, or the like.

The memory device 108 is arranged between the sidewalls of the lower insulating structure 210 and over the lower insulating structure 210. In some embodiments, the memory device 108 comprises a bottom electrode 110 that is separated from a multi-layer top electrode 114 by way of a data storage structure 112. In some embodiments, the bottom electrode 110 may comprise a diffusion barrier layer 110a and a bottom metal layer 110b over the diffusion barrier layer 110a. In some embodiments, a capping layer 212 may be disposed between the data storage structure 112 and the multi-layer top electrode 114. The capping layer 212 is configured to store oxygen, which can facilitate resistance changes within the data storage structure 112.

In some embodiments, a hard mask layer 216 may be disposed on the multi-layer top electrode 114. One or more sidewall spacers 218 may be disposed on opposing sides of the multi-layer top electrode 114 and the hard mask layer 216. In some embodiments, the hard mask layer 216 may comprise a metal (e.g., titanium, tantalum, or the like) and/or a dielectric (e.g., a nitride, a carbide, or the like). In some embodiments, the one or more sidewall spacer 218 may comprise an oxide (e.g., silicon rich oxide), a nitride (e.g., silicon nitride), a carbide (e.g., silicon carbide), or the like. A top electrode via 116 extends through the upper ILD layer 104e to electrically contact the multi-layer top electrode 114.

In some embodiments, a top electrode oxide 222 separates the multi-layer top electrode 114 from the top electrode via 116.

The multi-layer top electrode 114 comprises a first top electrode layer 114a and a second top electrode layer 114b over the first top electrode layer 114a. The second top electrode layer 114b comprises a higher resistance to oxidation than the first top electrode layer 114a. For example, in some embodiments, the first top electrode layer 114a has a first corrosion potential and the second top electrode layer 114b has a second corrosion potential that is greater than the first corrosion potential. In some embodiments, the first corrosion potential may be less than −0.8V, while the second corrosion potential may be greater than or equal to −0.8V. In other embodiments, the first corrosion potential may be less than −0.4V, while the second corrosion potential may be greater than or equal to −0.4V. The greater corrosion potential of the second top electrode layer 114b causes the second top electrode layer 114b to be less susceptible to corrosion (e.g., oxidation) than the first top electrode layer 114a.

In other embodiments, the first top electrode layer 114a may comprise a material that utilizes a first Gibbs free energy to form an oxide and the second top electrode layer 114b may comprise a material that utilizes a larger second Gibbs free energy to form an oxide. In some embodiments, the first top electrode layer 114a may comprise a material that utilizes a Gibbs Free energy of less than approximately −1,900 kJ/mol to form an oxide, while the second top electrode layer 114b may comprise a material that utilizes a Gibbs Free energy of greater than approximately −1,100 kJ/mol to form an oxide. In other embodiments, the second top electrode layer 114b may comprise a material that utilizes a Gibbs Free energy of greater than approximately −600 kJ/mol to form an oxide. In yet other embodiments, the second top electrode layer 114b may comprise a material that utilizes a Gibbs Free energy of greater than approximately −400 kJ/mol to form an oxide.

Because the second top electrode layer 114b is more resistant to oxidation than the first top electrode layer 114a, a thickness of the top electrode oxide 222 on the second top electrode layer 114b is relatively small. For example, in some embodiments, the thickness of the top electrode oxide 222 may be less than or equal to approximately 10 Å. In other embodiments, the thickness of the top electrode oxide 222 may be less than or equal to approximately 5 Å. The relatively small thickness of the top electrode oxide 222 provides for a relatively low resistance (e.g., less than approximately 60 Ohms/sq) between the multi-layer top electrode 114 and the top electrode via 116.

Furthermore, the resistance of the second top electrode layer 114b to oxidation also limits a location of an oxygen reservoir within the multi-layer top electrode 114 to a close proximity to the data storage structure 112. By keeping the oxygen reservoir in close proximity to the data storage structure 112, resistive switching is improved since a distance that oxygen molecules have to travel between the oxygen reservoir and tahe conductive filament is reduced.

To prevent an etchant used to form the top electrode via 116 from over-etching through the second top electrode layer 114b (i.e., to prevent exposure of the first top electrode layer 114a during fabrication), the second top electrode layer 114b may also comprise a material that has a high resistance to etching (e.g., using a fluorine based etching gas). A high resistance to etching allows the second top electrode layer 114b to separate the top electrode via 116 from the first top electrode layer 114a. By separating the top electrode via 116 from the first top electrode layer 114a, the first top electrode layer 114a is not exposed to an ambient environment during fabrication, thereby preventing formation of a thick oxide between the multi-layer top electrode 114 and the top electrode via 116.

In some embodiments, the second top electrode layer 114b may comprise a material that has a higher boiling point when exposed to an etchant comprising a fluorine gas than the first top electrode layer 114a. The higher boiling point of the second top electrode layer 114b makes the second top electrode layer 114b more difficult to etch. In some embodiments, the second top electrode layer 114b may comprise a material that has a boiling point of greater than or equal to approximately 550° C. when exposed to an etchant comprising a fluorine gas. In other embodiments, the second top electrode layer 114b may comprise a material that has a boiling point of greater than or equal to approximately 800° C. when exposed to an etchant comprising a fluorine gas. In yet other embodiments, the second top electrode layer 114b may comprise a material that has a boiling point of greater than or equal to approximately 1,500° C. when exposed to an etchant comprising a fluorine gas. In some embodiments, the second top electrode layer 114b may comprise a material having boiling point of greater than or equal to approximately 300° C. when exposed to an etchant comprising a fluorine gas, while the first top electrode layer 114a may comprise a material having boiling point of less than approximately 300° C. when exposed to an etchant comprising a fluorine gas.

In some embodiments, the second top electrode layer may also have a thickness in a range of between approximately 20 angstroms (Å) and approximately 300 Å. Having a second top electrode layer 114b with a thickness of greater than 20 Å allows the second top electrode layer 114b to prevent the top electrode via 116 from extending through the second top electrode layer 114b during fabrication.

Furthermore, in some additional embodiments, the first top electrode layer 114a may comprise a material having a first resistivity and the second top electrode layer 114b may comprise a material having a second resistivity that is greater than the first resistivity. For example, in some embodiments, the first top electrode layer 114a may comprise a material having a resistivity of less than approximately 20 µOhm-cm, while the second top electrode layer 114b may have a material having a resistivity of greater than approximately 100 µOhm-cm. In such embodiments, the lower resistance of the first top electrode layer 114a may reduce an overall resistance of the multi-layer top electrode 114. Furthermore, limiting a thickness of the second top electrode layer 114b to less than approximately 300 Å allows for the multi-layer top electrode 114 to have a relatively low overall resistance that provides for good performance of the memory device 108. In some embodiments, the first top electrode layer 114a has a greater thickness than the second top electrode layer 114b to further improve the relatively low overall resistance.

In some embodiments, the first top electrode layer 114a may comprise a metal such as titanium, tantalum, or the like. In some embodiments, the second top electrode layer 114b may comprise a metal and/or a metal-nitride. For example, in various embodiments, the second top electrode layer 114b may comprise titanium nitride, ruthenium, tungsten, tin, zirconium, aluminum nitride, silver, strontium, thallium, vanadium, zirconium nitride, hafnium nitride, or the like.

Figure 3:
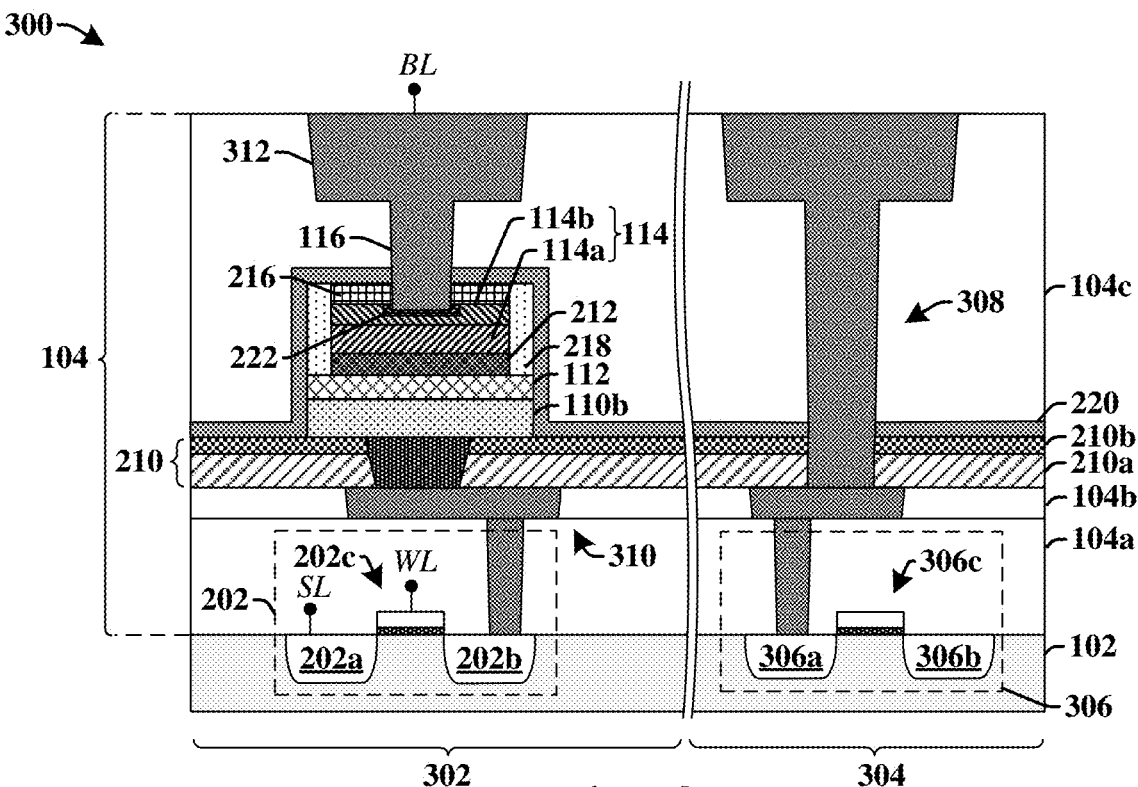
FIG. 3 illustrates a cross-sectional view of some additional embodiments of an integrated chip having a memory device comprising a multi-layer top electrode.

FIG. 3 illustrates a cross-sectional view of some additional embodiments of an integrated chip 300 having a memory device comprising a multi-layer top electrode.

The integrated chip 300 comprises a substrate 102 including an embedded memory region 302 and a logic region 304. A dielectric structure 104 is arranged over the substrate 102. The dielectric structure 104 comprises a plurality of stacked ILD layers 104a-104c. In some embodiments, the plurality of stacked ILD layers 104a-104c may comprise one or more of silicon dioxide, SiCOH, a fluorosilicate glass, a silicate glass (e.g., borophosphate silicate glass (BSG), phosphosilicate glass (PSG), borophosphosilicate glass (BPSG), fluorosilicate glass (FSG), undoped silicate glass (USG), or the like), or the like. In some embodiments, two or more adjacent ones of the plurality of stacked ILD layers 104a-104c may be separated by an etch stop layer (not shown) comprising a nitride, a carbide, or the like.

The logic region 304 comprises a transistor device 306 arranged within the substrate 102. The transistor device 306 comprises a source region 306a, a drain region 306b separated from the source region 306a by a channel region, and a gate structure 306c over the channel region. The source region 306a is coupled to a first plurality of interconnect layers 308 surrounded by the dielectric structure 104. The first plurality of interconnect layers 308 comprise a conductive contact, interconnect wires, and/or interconnect vias. In some embodiments, the first plurality of interconnect layers 308 may comprise one or more of copper, tungsten, aluminum, or the like.

The embedded memory region 302 comprises an access device 202 arranged within the substrate 102. In some embodiments, the access device 202 may comprise a MOSFET device having a gate structure 202c that is laterally arranged between a source region 202a and a drain region 202b. In some embodiments, the gate structure 202c may comprise a gate electrode that is separated from the substrate 102 by a gate dielectric. In some such embodiments, the source region 202a is coupled to a source-line SL and the gate structure 202c is coupled to a word-line WL. In other embodiments, the access device 202 may comprise a HEMT, a BJT, a JFET, or the like.

The access device 202 is coupled to a memory device 108 by way of a plurality of lower interconnect layers 310 disposed within a plurality of lower ILD layers 104a-104b. In some embodiments, a lower insulating structure 210 vertically separates the plurality of lower ILD layers 104a-104b from the memory device 108. In such embodiments, the bottom electrode 110 extends through an opening in the lower insulating structure 210 to electrically contact one of the plurality of lower interconnect layers 310. In some embodiments, the lower insulating structure 210 comprises a first dielectric layer 210a and a second dielectric layer 210b over the first dielectric layer 210a. In some embodiments, the first dielectric layer 210a may comprise silicon rich oxide, silicon carbide, silicon nitride, or the like. In some embodiments, the second dielectric layer 210b may comprise silicon carbide, silicon nitride, or the like.

The memory device 108 comprises a bottom electrode 110 separated from a multi-layer top electrode 114 by way of a data storage structure 112. In some embodiments, the bottom electrode 110 may comprise a diffusion barrier layer 110a and a bottom metal layer 110b over the diffusion barrier layer 110a. In some embodiments, the diffusion barrier layer 110a may comprise tantalum nitride, titanium nitride, or the like. In some embodiments, the bottom metal layer 110b may comprise tantalum, titanium, tantalum nitride, titanium nitride, platinum, nickel, hafnium, zirconium, ruthenium, iridium, or the like.

In some embodiments, the memory device 108 comprises an RRAM device. In such embodiments, the data storage structure 112 comprises a high-k dielectric material, such as hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. In other embodiments, the memory device 108 may comprise a magnetoresistive random access memory (MRAM) device, a ferroelectric random access memory (FRAM) device, or the like. In such embodiments, the data storage structure 112 may comprise a magnetic tunnel junction, a ferroelectric material, or the like.

In some embodiments, a capping layer 212 is arranged between the data storage structure 112 and the multi-layer top electrode 114. In some embodiments, the capping layer 212 may comprise a metal or a metal oxide that is relatively low in oxygen concentration. For example, in some embodiments, the capping layer 212 may comprise a metal such as tantalum (Ta), tantalum nitride (TaN), titanium (Ti), titanium nitride (TiN), hafnium (Hf), platinum (Pt), aluminum (Al), or the like. In other embodiments, the capping layer 212 may comprise a metal oxide such as titanium oxide (TiO), hafnium oxide (HfO), zirconium oxide (ZrO), germanium oxide (GeO), cesium oxide (CeO).

The multi-layer top electrode 114 comprises a first top electrode layer 114a and a second top electrode layer 114b. A top electrode via 116 is disposed on the second top electrode layer 114b and an upper interconnect wire 312 is coupled to the top electrode via 116. The upper interconnect wire 312 extends laterally past opposing sidewalls of the top electrode via 116. In some embodiments, the top electrode via 116 and the upper interconnect wire 312 may comprise one or more of aluminum, copper, tungsten, or the like. In some embodiments, the upper interconnect wire 312 is further coupled to a bit-line BL. During operation, signals (e.g., voltages and/or currents) may be selectively applied to the word-line WL, the source-line SL, and the bit-line BL to read data from and to write data to the memory device 108.

Figure 4A:
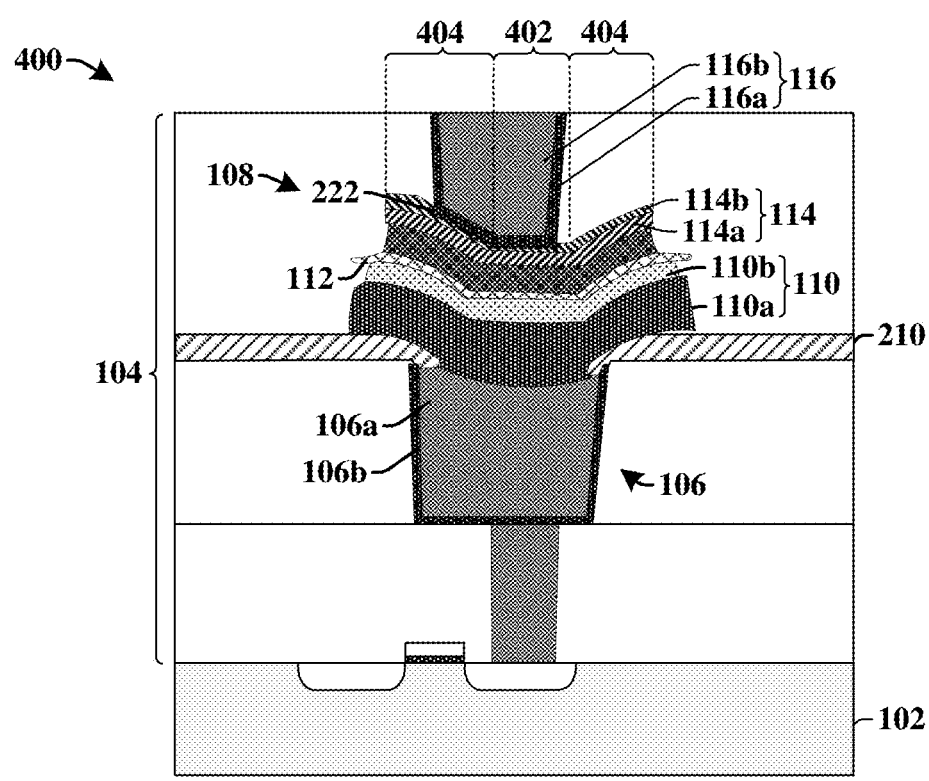
FIGS. 4A-6C illustrate some additional embodiments of integrated chips having a memory device comprising a multi-layer top electrode.
Figure 4B:
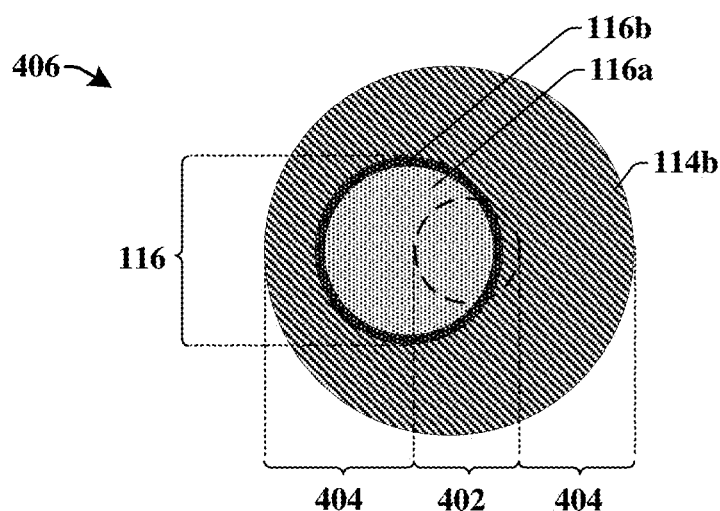

FIGS. 4A-4B illustrate some additional embodiments of an integrated chip having a memory device comprising a multi-layer top electrode. FIG. 4A illustrates a cross-sectional view 400 of the integrated chip. FIG. 4B illustrates a top-view 406 that illustrates a top electrode via and a second top electrode layer (but that excludes other layers such as an upper ILD layer, etc.)

As shown in cross-sectional view 400 of FIG. 4A, a memory device 108 is disposed within a dielectric structure 104 over a substrate 102. In some embodiments, the memory device 108 may be over a lower insulating structure 210 that has sidewalls defining an opening extending through the lower insulating structure 210. The opening may be directly over a lower interconnect 106. In some embodiments, the lower interconnect 106 may comprise a conductive core 106a and a diffusion barrier layer 106b surrounding the conductive core 106a. The diffusion barrier layer 106b may comprise titanium nitride, tantalum nitride, or the like. The conductive core 106a may comprise a metal such as copper, aluminum, tungsten, or the like.

The memory device 108 comprises a data storage structure 112 arranged between a bottom electrode 110 and a multi-layer top electrode 114. The bottom electrode 110 comprises a diffusion barrier layer 110a and a bottom metal layer 110b over the diffusion barrier layer 110a. In some embodiments, the diffusion barrier layer 110a extends from within the opening in the lower insulating structure 210 to over the lower insulating structure 210. In some embodiments, the memory device 108 comprises a central region 402 disposed over the opening and a peripheral region 404 laterally surrounding the central region 402. The multi-layer top electrode 114 has a first upper surface within the central region 402 that is recessed below a second upper surface of the multi-layer top electrode 114 within the peripheral region 404.

A top electrode via 116 is disposed over the multi-layer top electrode 114. The top electrode via 116 comprises a barrier layer 116a that surrounds a conductive core 116b. In some embodiments, the barrier layer 116a may be separated from the second top electrode layer 114b by way of a top electrode oxide 222. In various embodiments, the barrier layer 116a may be configured to act as a diffusion barrier layer and/or a glue layer. The barrier layer 116a may comprise titanium nitride, tantalum nitride, or the like. The conductive core 116b may comprise a metal such as copper, aluminum, tungsten, or the like.

As shown in top-view 406 of FIG. 4B, the peripheral region 404 extends completely around the central region 402 of the memory device 108. Furthermore, the barrier layer 116a of the top electrode via 116 extends completely around the conductive core 116b of the top electrode via 116.

Referring again to cross-sectional view 400 of FIG. 4A, the multi-layer top electrode 114 comprises a first top electrode layer 114a and a second top electrode layer 114b. In some embodiments, the second top electrode layer 114b has a first curved surface that faces the first top electrode layer 114a. In some additional embodiments, the second top electrode layer 114b has a second curved surface that faces away from the first top electrode layer 114a. In some embodiments, the top electrode oxide 222 is arranged along the second curved surface.

In some embodiments, the data storage structure 112, the bottom electrode 110, and the multi-layer top electrode 114 may have different widths. For example, in some embodiments, the data storage structure 112 may have a greater width than the multi-layer top electrode 114 and the bottom metal layer 110b. In such embodiments, the data storage structure 112 laterally protrudes outward from sidewalls of the multi-layer top electrode 114 and the bottom metal layer 110b.

Figure 5:
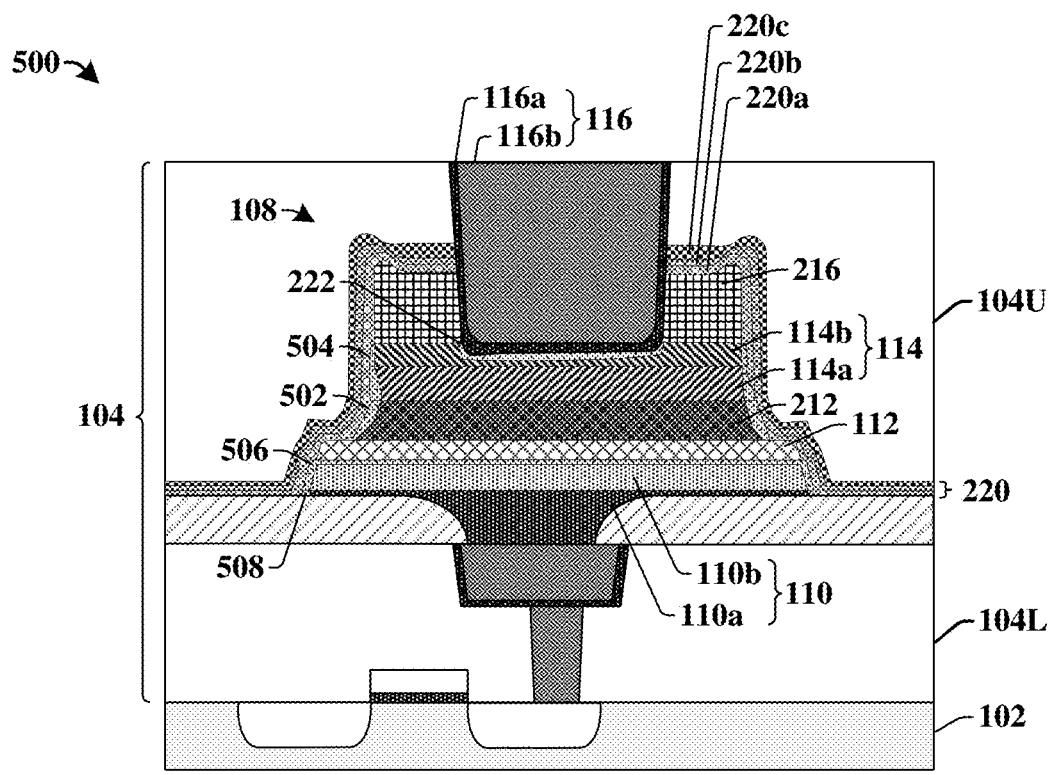

FIG. 5 illustrates a cross-sectional view of some additional embodiments of an integrated chip 500 having a memory device comprising a multi-layer top electrode.

The integrated chip 500 comprises a memory device 108 disposed within a dielectric structure 104 over a substrate 102. The memory device 108 comprises a bottom electrode 110 separated from a multi-layer top electrode 114 by way of a data storage structure 112 and a capping layer 212. In some embodiments, the bottom electrode 110 comprises a diffusion barrier layer 110a and a bottom metal layer 110b. The multi-layer top electrode 114 comprises a first top electrode layer 114a and a second top electrode layer 114b over the first top electrode layer 114a. The second top electrode layer 114b has a higher corrosion potential than the first top electrode layer 114a. A hard mask layer 216 may be arranged over the second top electrode layer 114b.

A first oxide 502 may be arranged along outer edges of the first top electrode layer 114a and a second oxide 504 may be arranged along outer edges of the second top electrode layer 114b. In some embodiments, the first oxide 502 may have a greater thickness than the second oxide 504. In some embodiments, the first oxide 502 may comprise a first material (e.g., tantalum oxide) and the second oxide 504 may comprise a second material (e.g., titanium oxynitride) that is different than the first material. In some embodiments, the first oxide 502 and/or the second oxide 504 may laterally extend past outermost sidewalls of the hard mask layer 216.

A top electrode via 116 is disposed on the second top electrode layer 114b. A top electrode oxide 222 may be disposed between the second top electrode layer 114b and the top electrode via 116. In some embodiments, the top electrode oxide 222 may comprise a same material (e.g., titanium oxynitride) as the second oxide 504. In some embodiments, the bottom electrode 110 may be surrounded by a third oxide 506 that is disposed along sidewalls of the bottom metal layer 110b and/or a fourth oxide 508 that is disposed along sidewalls of the diffusion barrier layer 110a.

In some embodiments, an upper insulating structure 220 may be disposed over the memory device 108. The upper insulating structure 220 separates the memory device 108 from an upper ILD layer 104U. In some embodiments, the upper insulating structure 220 may comprise a plurality of insulating layers 220a-220c. In some embodiments, the plurality of insulating layers 220a-220c may comprise one or more of silicon carbide, silicon nitride, silicon oxynitride, plasma enhanced (PE) silicon oxynitride (PE-SiON), PE oxide (PE-Ox), and/or the like. For example, in some embodiments, a first insulating layer 220a may comprise silicon nitride, a second insulating layer 220b may comprise silicon carbide, and a third insulating layer 220c may comprise silicon oxide.

It has been appreciated that memory devices formed on different parts of a wafer may be exposed to different tolerances during fabrication of the wafer. For example, a memory device formed along an outer edge of wafer may be exposed to different etch and/or deposition tolerances than a memory device formed within a central region of the wafer. It has also been appreciated that the different tolerances may lead to different etching rates and/or oxidation thicknesses, which can result in performance problems for memory devices. However, due to the high resistance to oxidation and etching, the disclosed second top electrode layer is able to reduce variations in performance over different areas of a wafer.

Figure 6A:
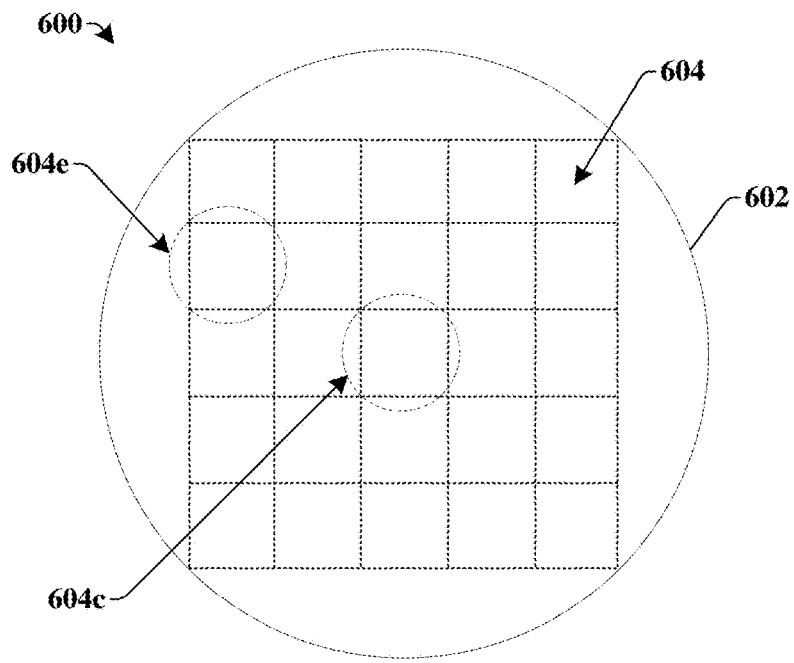

For example, FIG. 6A illustrates a top-view 600 of some embodiments of a wafer 602 comprising a plurality of die regions 604, respectively corresponding to an integrated chip die. The plurality of die regions 604 comprise a central die region 604c and an edge die region 604e. The central die region 604c is closer to a center of the wafer 602 than the edge die region 604e.

Figures 6B, 6C:
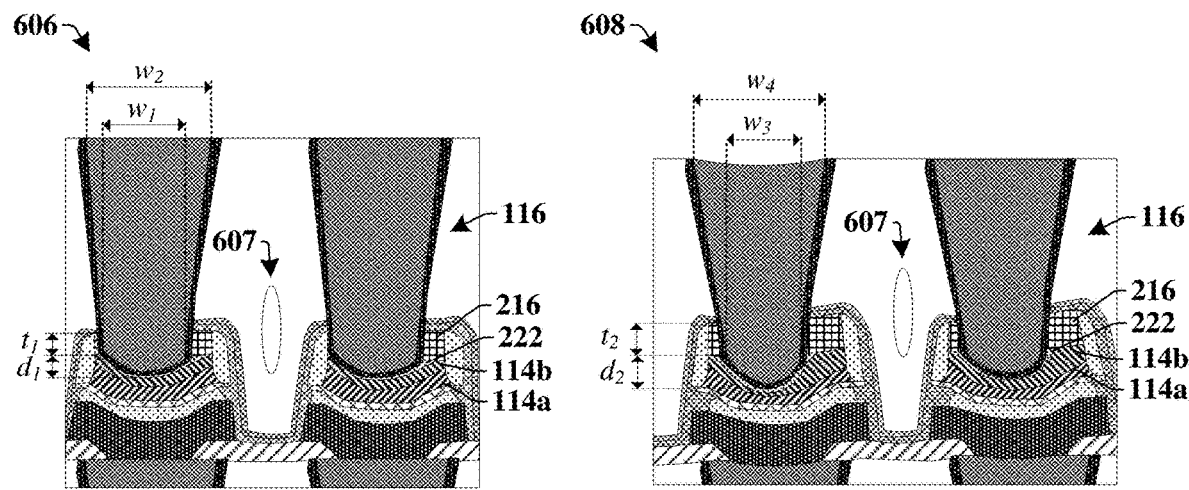

FIG. 6B illustrates a cross-sectional view 606 of some embodiments of a first die within the central die region (604c of FIG. 6A) and FIG. 6C illustrates a cross-sectional view 608 of some embodiments of a second die within the edge die region (604e of FIG. 6A).

As shown in cross-sectional view 606 of FIG. 6B, the first die within the central die region (604c of FIG. 6A) comprises first memory devices disposed within an upper ILD layer 104U. In some embodiments, the upper ILD layer 104U may comprise one or more surfaces defining an air-gap 607 disposed between the first memory devices. The first memory devices respectively have a second top electrode layer 114b disposed on a first top electrode layer 114a. The first memory devices further comprise a hard mask layer 216 disposed on the second top electrode layer 114b. The hard mask layer 216 comprises a first thickness $t_1$ over the second top electrode layer 114b. A top electrode via 116 extends through the hard mask layer 216 to electrically contact the second top electrode layer 114b. In some embodiments, a top electrode oxide 222 may separate the top electrode via 116 from the second top electrode layer 114b. In some embodiments, the top electrode via 116 may have a first width $w_1$ at a height of the second top electrode layer 114b and a second width $w_2$ at a top of the top electrode via 116. In some embodiments, the first width $w_1$ may be between approximately 50% and approximately 75% of the second width $w_2$. In some embodiments, the top electrode via 116 may extend to a first depth $d_1$ below a top of the second top electrode layer 114b.

As shown in cross-sectional view 608 of FIG. 6C, the second die within the edge die region (604e of FIG. 6A) comprises second memory devices respectively having a second top electrode layer 114b disposed on a first top electrode layer 114a. The second memory devices further comprise a hard mask layer 216 disposed on the second top electrode layer 114b. Due to differences in process tolerances, the hard mask layer 216 of the second memory device comprises a second thickness $t_2$ that is larger than the first thickness $t_1$. In some embodiments, the first thickness $t_1$ may be between approximately 50% and approximately 75% of the second thickness $t_2$.

A top electrode via 116 extends through the hard mask layer 216 to electrically contact the second top electrode layer 114b. In some embodiments, a top electrode oxide 222 may separate the top electrode via 116 from the second top electrode layer 114b. In some embodiments, the top electrode via 116 may have a third width $w_3$ at a height of the second top electrode layer 114b and a fourth width $w_4$ at a top of the top electrode via 116. In some embodiments, the third width $w_3$ may be between approximately 50% and approximately 70% of the fourth width $w_4$. In some embodiments, the top electrode via 116 may extend to a second depth $d_2$ below a top of the second top electrode layer 114b that is larger than the first depth $d_1$.

Because the second top electrode layer 114b may be configured to have a high resistance to etching, the second top electrode layer 114b is able to prevent the top electrode via 116 from contacting the first top electrode layer 114a within both the first memory device 108a and within the second memory device 108b. Furthermore, because the second top electrode layer 114b has a low corrosion potential, a thickness of the top electrode oxide 222 within the first memory device (FIG. 6B) and the second memory device (FIG. 6C) are relatively similar despite variations in process tolerances, thereby providing for a small difference in resistance of memory devices over different regions of the wafer 602. For example, the second top electrode layer may reduce a variation in top electrode via resistance over a wafer to less than approximately 10% (e.g., in comparison to a variation of between approximately 40-50% for a wafer having memory devices within a single layer top electrode).

FIGS. 7-17 illustrate cross-sectional views 700-1700 of some embodiments of a method of forming an integrated chip having a memory device comprising a multi-layer top electrode configured to mitigate oxide formation during fabrication. Although FIGS. 7-17 are described in relation to a method, it will be appreciated that the structures disclosed in FIGS. 7-17 are not limited to such a method, but instead may stand alone as structures independent of the method.

Figure 7:
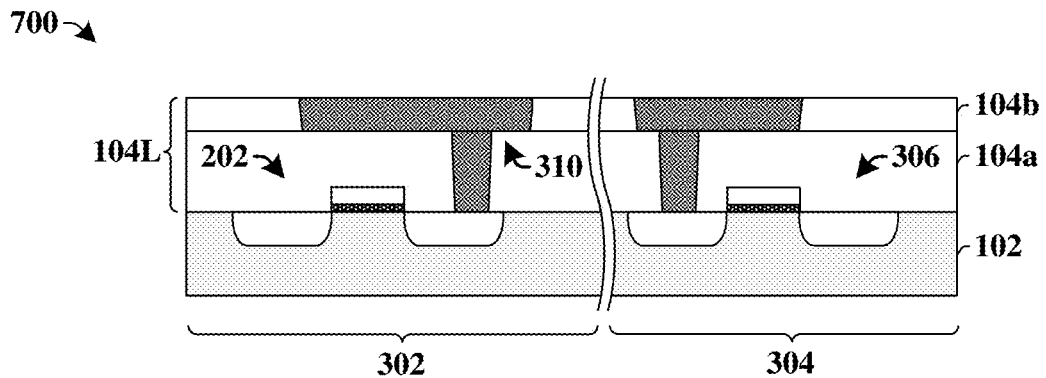
FIGS. 7-17 illustrate cross-sectional views of some embodiments of a method of forming an integrated chip having a memory device comprising a multi-layer top electrode configured to mitigate oxide formation during fabrication.

As shown in cross-sectional view 700 of FIG. 7, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. The substrate 102 comprises an embedded memory region 302 and a logic region 304. In some embodiments, an access device 202 is formed within the embedded memory region 302 and a transistor device 306 is formed within the logic region 304. In some embodiments, the access device 202 and/or the transistor device 306 may comprise a transistor. In some such embodiments, the access device 202 and/or the transistor device 306 may be formed by depositing a gate dielectric film and a gate electrode film over the substrate 102. The gate dielectric film and the gate electrode film are subsequently patterned to form a gate dielectric and a gate electrode. The substrate 102 may be subsequently implanted to form a source region and a drain region within the substrate 102 on opposing sides of the gate electrode.

In some embodiments, one or more lower interconnect layers 310 may be formed within one or more lower ILD layers 104L formed over the substrate 102. In some embodiments, the one or more lower ILD layers 104L may comprise a first lower ILD layer 104a and a second lower ILD layer 104b. In some embodiments, the one or more lower interconnect layers 310 may comprise one or more of a conductive contact, an interconnect wire, and an interconnect via. The one or one or more lower interconnect layers 310 may be formed by forming a lower ILD layer of the one or more lower ILD layers 104a-104b (e.g., an oxide, a low-k dielectric, or an ultra low-k dielectric) over the substrate 102, selectively etching the lower ILD layer to define a via hole and/or a trench within the lower ILD layer, forming a conductive material (e.g., copper, aluminum, etc.) within the via hole and/or the trench, and performing a planarization process (e.g., a chemical mechanical planarization process) to remove excess of the conductive material from over the lower ILD layer.

Figure 8:
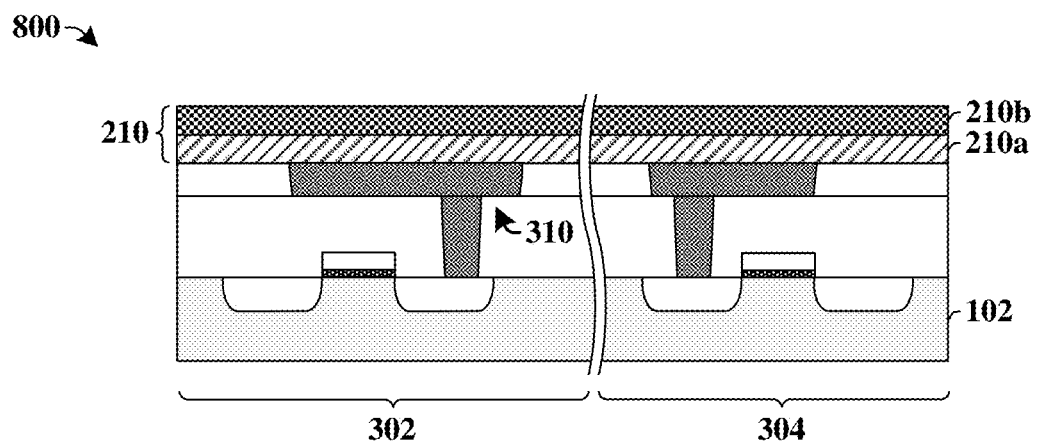

As shown in cross-sectional view 800 of FIG. 8, a lower insulating structure 210 is formed over the one or more lower interconnect layers 310. In some embodiments, the lower insulating structure 210 comprises a plurality of different stacked dielectric materials. For example, in some embodiments, the lower insulating structure 210 comprises a first dielectric layer 210a and a second dielectric layer 210b over the first dielectric layer 210a. In some embodiments, the first dielectric layer 210a may comprise silicon rich oxide, silicon carbide, silicon nitride, or the like. In some embodiments, the second dielectric layer 210b may comprise silicon carbide, silicon nitride, or the like. In some embodiments, the lower insulating structure 210 may be formed by one or more deposition processes (e.g., a physical vapor deposition (PVD) process, a chemical vapor deposition (CVD) process, a plasma enhanced CVD (PE-CVD) process, or the like).

Figure 9:
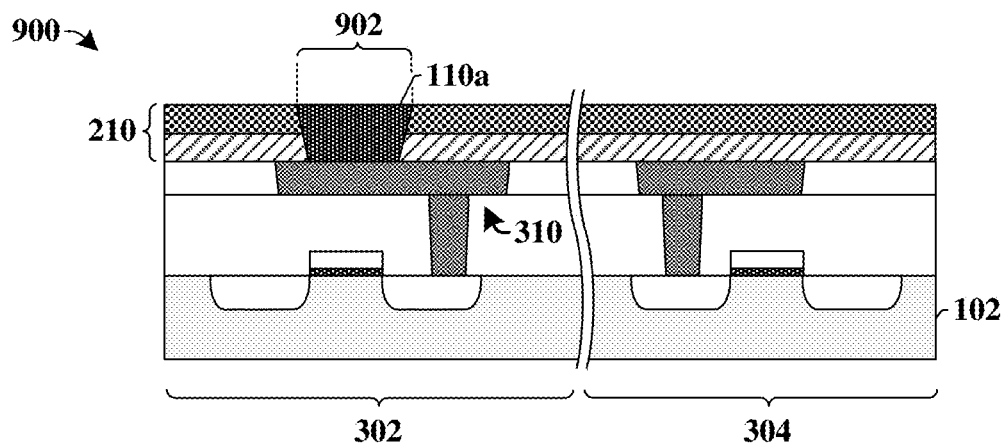

As shown in cross-sectional view 900 of FIG. 9, a diffusion barrier layer 110a is formed within an opening 902 extending through the lower insulating structure 210. In some embodiments, the lower insulating structure 210 is selectively etched to define the opening 902. The opening 902 extends through the lower insulating structure 210 and exposes an upper surface of one of the one or more lower interconnect layers 310. The diffusion barrier layer 110a is subsequently formed within the opening 902. In some embodiments, the diffusion barrier layer 110a may be formed by a deposition process (e.g., a PVD process, a CVD process, a PE-CVD process, or the like). In some embodiments, a planarization process (e.g., a chemical mechanical planarization (CMP) process) may be performed after the deposition process to remove excess material of the diffusion barrier layer 110a from over a top of the lower insulating structure 210. In other embodiments (not shown), a planarization process is not performed. In such embodiments, the diffusion barrier layer 110a may completely cover the lower insulating structure 210 until it is patterned at a later time (e.g., according to a second patterning process performed in FIG. 14).

Figure 10:
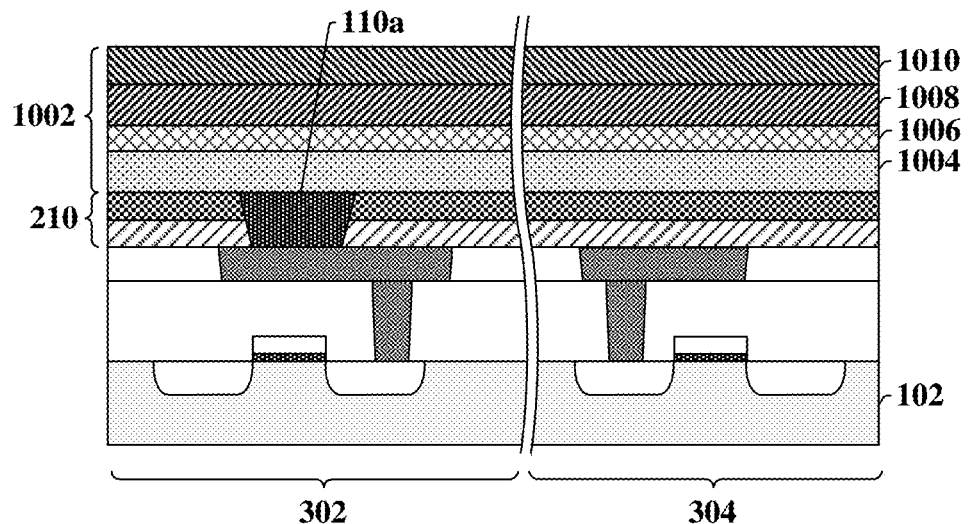

As shown in cross-sectional view 1000 of FIG. 10, a memory device stack 1002 is formed over the diffusion barrier layer 110a and the lower insulating structure 210. In some embodiments, the memory device stack 1002 may comprise a bottom electrode layer 1004, a data storage layer 1006 formed over the bottom electrode layer 1004, a first top electrode material 1008 formed over the data storage layer 1006, and a second top electrode material 1010 formed over the first top electrode material 1008.

In some embodiments, the bottom electrode layer 1004 may comprise a metal, such as titanium, tantalum, or the like. In some embodiments, the data storage layer 1006 may comprise a high-k dielectric material such as aluminum oxide, hafnium oxide, or the like. In some embodiments, the first top electrode material 1008 may comprise a metal such as titanium, tantalum, or the like. In some embodiments, the second top electrode material 1010 may comprise a metal and/or a metal-nitride. For example, in various embodiments, the second top electrode material 1010 may comprise titanium nitride, ruthenium, tungsten, tin, zirconium, aluminum nitride, silver, strontium, thallium, vanadium, zirconium nitride, hafnium nitride, or the like. The second top electrode material 1010 comprises a higher resistance to oxidation than the first top electrode material 1008. For example, in some embodiments, the first top electrode material 1008 has a first corrosion potential and the second top electrode material 1010 has a second corrosion potential that is greater than the first corrosion potential.

In some embodiments, the bottom electrode layer 1004, the data storage layer 1006, the first top electrode material 1008, and the second top electrode material 1010 may be formed by way of a plurality of different deposition processes (e.g., CVD, PE-CVD, sputtering, ALD, or the like). In some embodiments, the first top electrode material 1008 and the second top electrode material 1010 may be formed in-situ (e.g., without breaking a vacuum on a processing chamber).

In some embodiments, the second top electrode material 1010 may be deposited by way of a sputtering process. The sputtering process may be performed by introducing an inert sputtering gas into a processing chamber and then applying a bias voltage to a sputtering target. In some embodiments, the second top electrode material 1010 may comprise a nitride. In such embodiments, a nitrogen gas may be further introduced into the processing chamber to form a second top electrode material 1010 comprising a metal nitride (e.g., titanium nitride). In some such embodiments, the inert sputtering gas may comprise argon, while the sputtering target may comprise titanium. In some embodiments, a bias of approximately 18,000 W may be applied to the sputtering target and a flow ratio of nitrogen ($N_2$)/argon (Ar) gases may be approximately 160:8. The resulting layer of titanium nitride has a roughness of less than approximately 10 Å (e.g., approximately 7 Å), a resistivity of less than approximately 119 μΩ-cm (e.g., approximately 100 μΩ-cm), and a density of greater than approximately 5.

Figure 11:
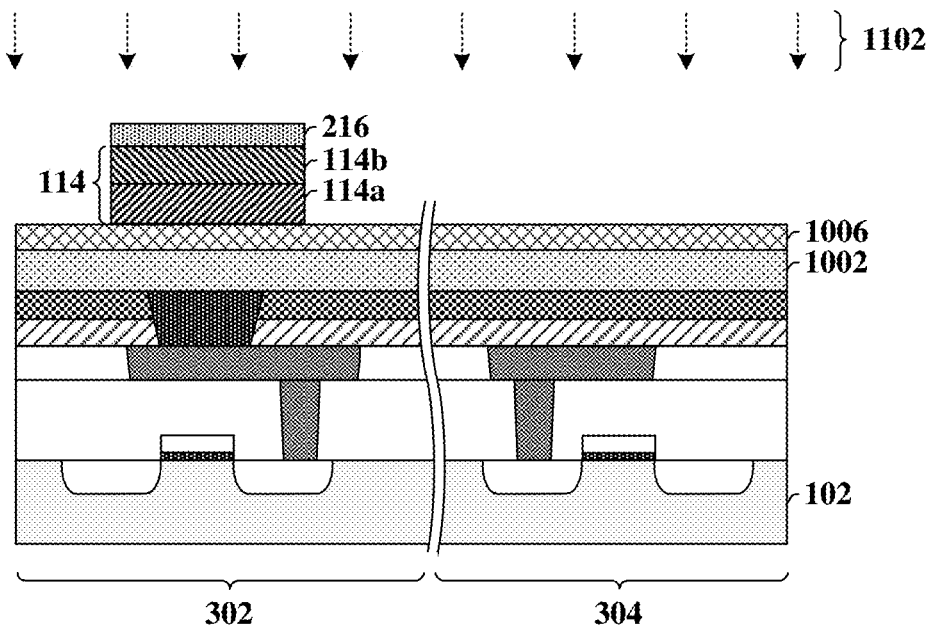

As shown in cross-sectional view 1100 of FIG. 11, a first patterning process is performed to define a multi-layer top electrode 114 having a first top electrode layer 114a and a second top electrode layer 114b. In some embodiments, the first patterning process selectively exposes the first top electrode material (1008 of FIG. 10) and the second top electrode material (1010 of FIG. 10) to a first etchant 1102 according to a hard mask layer 216. In various embodiments, the hard mask layer 216 may comprise a metal (e.g., titanium, titanium nitride, tantalum, or the like) and/or a dielectric material (e.g., silicon-nitride, silicon-carbide, or the like). In other embodiments (not shown), the first patterning process may selectively expose the first top electrode layer 114a and the second top electrode layer 114b to the first etchant 1102 according to a photosensitive material (e.g., photoresist).

Figure 12:
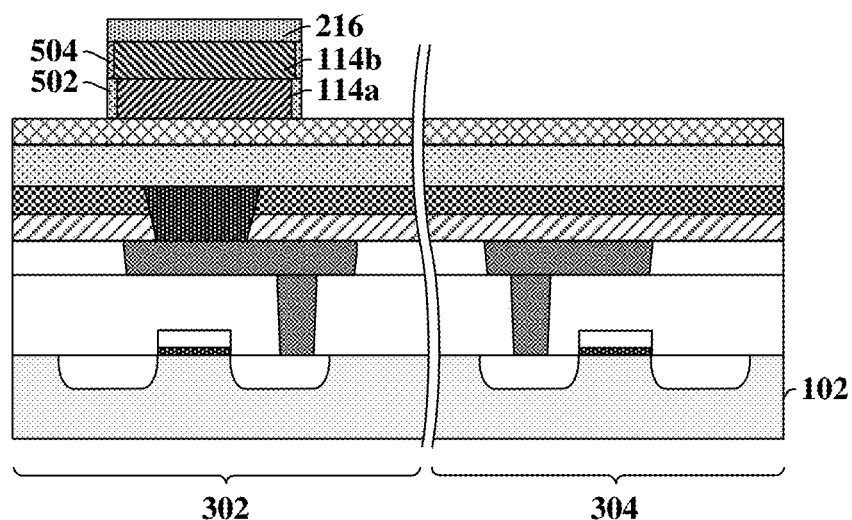

As shown in cross-sectional view 1200 of FIG. 12, the first top electrode layer 114a and the second top electrode layer 114b may be exposed to an ambient environment (e.g., air) after the first patterning process. For example, in some embodiments after the first patterning process the substrate 102 may be exposed to an ambient environment as it is moved from a first processing chamber used to perform the first patterning process to a second processing chamber used to perform a subsequent fabrication process. When exposed to the ambient environment, a first oxide 502 may form along outer edges of the first top electrode layer 114a and a second oxide 504 may form along outer edges of the second top electrode layer 114b. In some embodiments, the first oxide 502 may have a greater thickness than the second oxide 504. In some embodiments, the first oxide 502 may comprise a first material (e.g., tantalum oxide) and the second oxide 504 may comprise a second material (e.g., titanium oxynitride) that is different than the first material.

Figure 13:
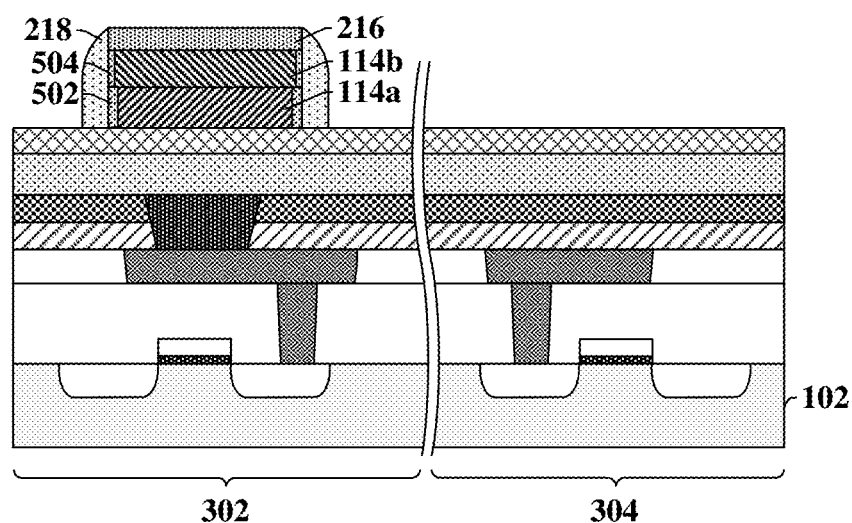

As shown in cross-sectional view 1300 of FIG. 13, one or more sidewall spacers 218 are formed along sidewalls of the first top electrode layer 114a, the second top electrode layer 114b, and the hard mask layer 216. In various embodiments, the one or more sidewall spacers 218 may comprise silicon nitride, silicon dioxide, silicon oxynitride, and/or the like. In some embodiments, the one or more sidewall spacers 218 may be formed by forming a spacer layer over the substrate 102. The spacer layer is subsequently exposed to an etchant (e.g., a dry etchant), which removes the spacer layer from horizontal surfaces. Removing the spacer layer from horizontal surfaces leaves a part of the spacer layer along opposing sidewalls of the first top electrode layer 114a, the second top electrode layer 114b, and the hard mask layer 216 as the one or more sidewall spacers 218.

Figure 14:
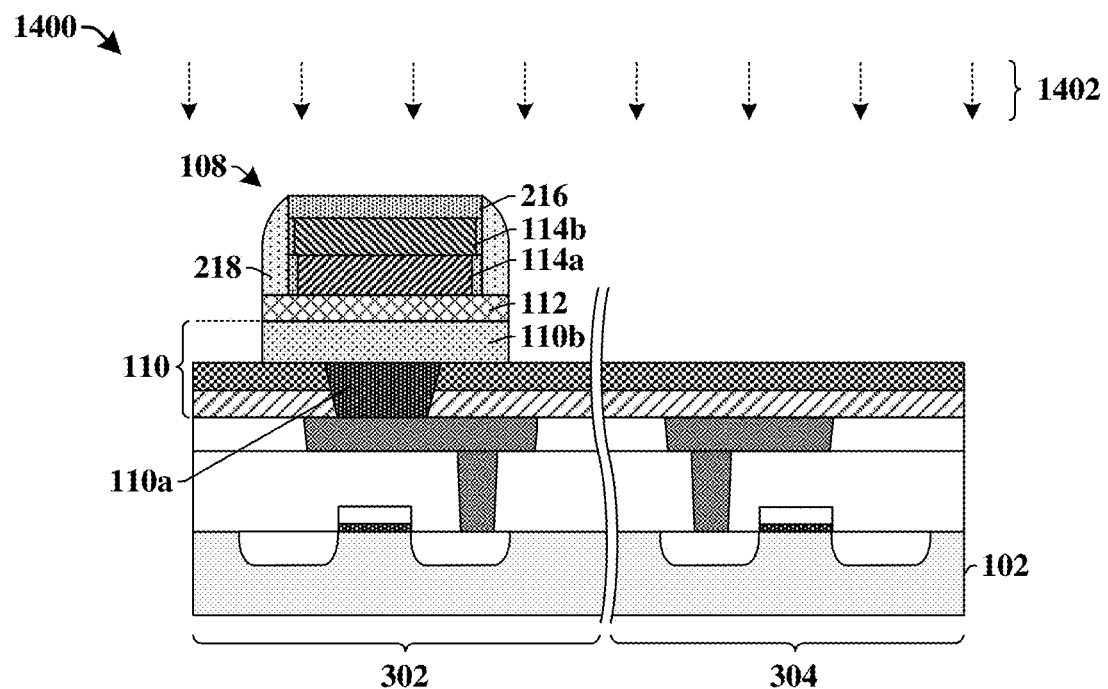

As shown in cross-sectional view 1400 of FIG. 14, a second patterning process is performed on the data storage layer (1006 of FIG. 13) and the bottom electrode layer (1004 of FIG. 13) to define a memory device 108 having a data storage structure 112 and a bottom electrode 110 comprising the diffusion barrier layer 110a and a bottom metal layer 110b. In some embodiments, the second patterning process selectively exposes the data storage structure (1006 of FIG. 13) and the bottom electrode layer (1004 of FIG. 13) to a second etchant 1402 in areas that are not covered by the hard mask layer 216 and the one or more sidewall spacers 218.

Figure 15:
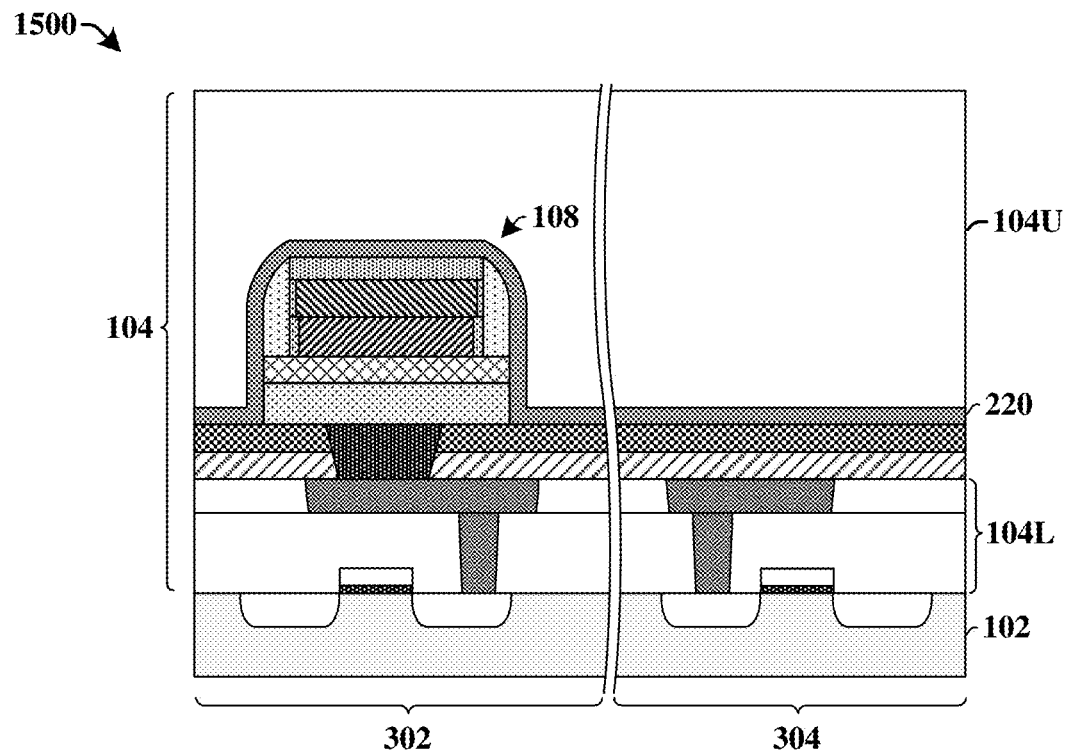

As shown in cross-sectional view 1500 of FIG. 15, an upper insulating structure 220 is formed over the memory device 108. In some embodiments, the upper insulating structure 220 may be formed using one or more deposition techniques (e.g., PVD, CVD, PE-CVD, ALD, sputtering, etc.). In various embodiments, the upper insulating structure 220 may comprise one or more of silicon carbide, tetraethyl orthosilicate (TEOS), or the like. An upper ILD layer 104U is formed over the upper insulating structure 220 to define a dielectric structure 104 over the substrate 102. In some embodiments, the upper ILD layer 104U may be formed by a deposition process (e.g., PVD, CVD, PE-CVD, ALD, or the like). In various embodiments, the upper ILD layer 104U may comprise one or more of silicon dioxide, carbon doped silicon dioxide, silicon oxynitride, BSG, PSG, BPSG, FSG, USG, a porous dielectric material, or the like.

Figure 16:
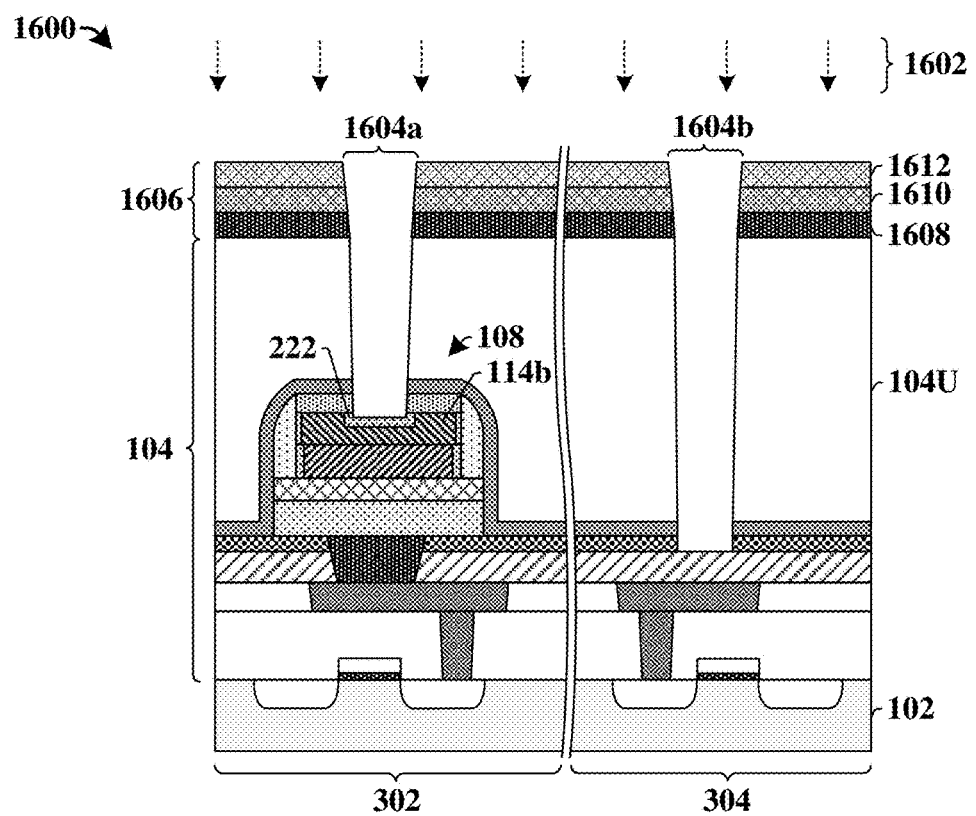

As shown in cross-sectional view 1600 of FIG. 16, via holes 1604a-1604b are formed within the upper ILD layer 104U. Within the embedded memory region 302, the via holes 1604a-1604b comprise a top electrode via hole 1604a that extends from a top surface of the upper ILD layer 104U to expose an upper surface of the second top electrode layer 114b. Within the logic region 304, the via holes 1604a-1604b comprise a via hole 1604b that extends from the top surface of the upper ILD layer 104U to vertically past the top electrode via hole 1604a. In some embodiments, a top electrode oxide 222 may form along the exposed upper surface of the second top electrode layer 114b exposed by the top electrode via hole 1604b.

In some embodiments, the upper interconnect via holes 1604a-1604b may be formed by a third patterning process that uses a third etchant 1602 to selectively etch the upper ILD layer 104U according to a masking layer 1606. In some embodiments, the third etchant 1602 may comprise a dry etchant having an etching chemistry comprising a fluorine based etchant (e.g., $CF_4$, $CH_2F_2$, $CHF_8$, or the like). In some embodiments, the masking layer 1606 may comprise a multi-layer hard mask. For example, in some embodiments, the masking layer 1606 may comprise a first hard mask layer 1608, a second hard mask layer 1610 over the first hard mask layer 1608, and a third hard mask layer 1612 over the second hard mask layer 1610. In some embodiments, the first hard mask layer 1608 may comprise an oxide, the second hard mask layer 1610 may comprise a nitride, and the third hard mask layer 1612 may comprise an oxide.

Figure 17:
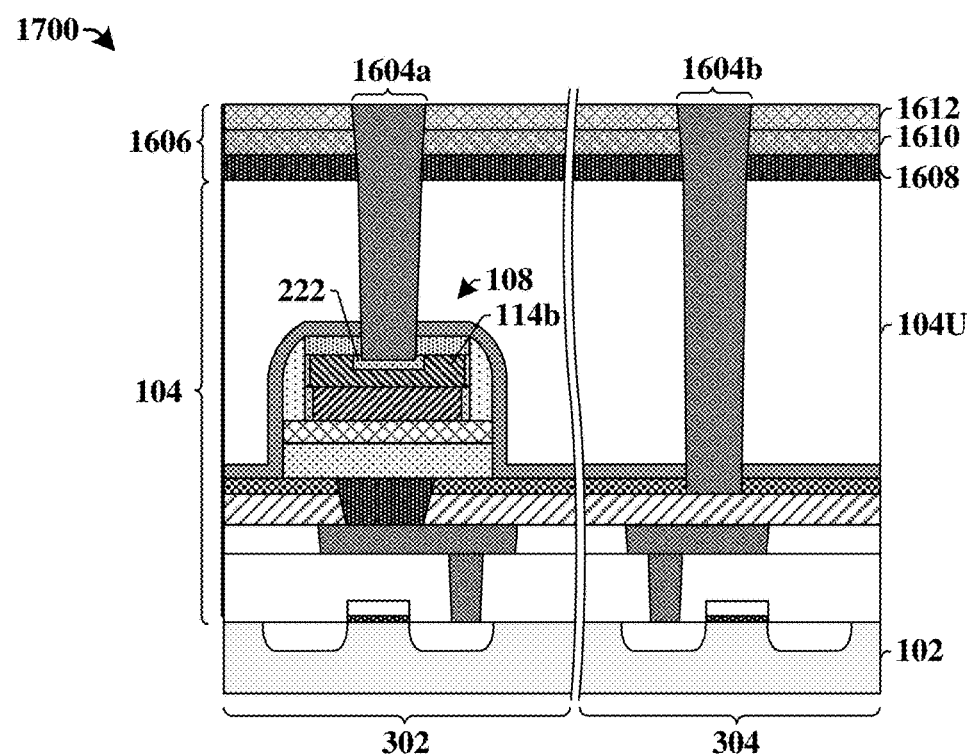

As shown in cross-sectional view 1700 of FIG. 17, a conductive material (e.g., copper, aluminum, etc.) is formed within the upper interconnect via holes 1604a-1604b. In some embodiments, after forming the conductive material within the upper interconnect via holes 1604a-1604b a planarization process (e.g., a CMP process) is performed to remove excess of the conductive material from over a top of the upper ILD layer 104U. In some embodiments, the planarization process may also remove the masking layer 1606.

Figure 18:
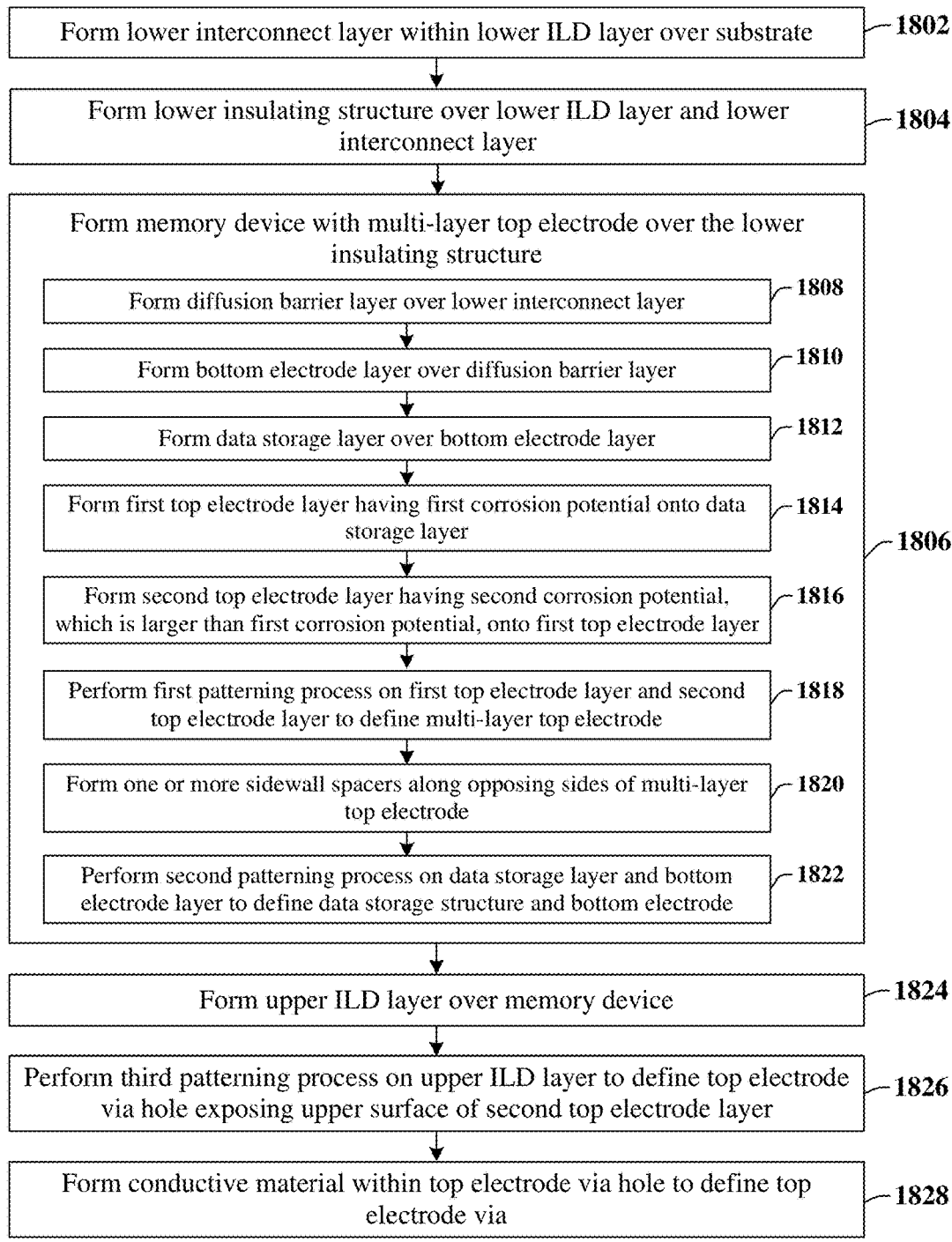
FIG. 18 illustrates a flow diagram of some embodiments of a method of forming an integrated chip having a memory device comprising a multi-layer top electrode configured to mitigate oxide formation during fabrication.

FIG. 18 illustrates a flow diagram of some embodiments of a method 1800 of forming an integrated chip having a memory device comprising a multi-layer top electrode configured to mitigate oxide formation during fabrication.

While method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, a lower interconnect layer is formed within a lower inter-level dielectric (ILD) layer over a substrate. FIG. 7 illustrates a cross-sectional view 700 of some embodiments corresponding to act 1802.

At act 1804, a lower insulating structure is formed over the lower ILD layer and the lower interconnect layer. FIG. 8 illustrates a cross-sectional view 800 of some embodiments corresponding to act 1804.

At act 1806, a memory device with a multi-layer top electrode is formed over the lower insulating structure. In some embodiments, the memory device may be formed according to acts 1808-1822.

At act 1808, a diffusion barrier layer is formed over the lower interconnect layer. FIG. 9 illustrates a cross-sectional view 900 of some embodiments corresponding to act 1808.

At act 1810, a bottom electrode layer is formed over the diffusion barrier layer. FIG. 10 illustrates a cross-sectional view 1000 of some embodiments corresponding to act 1810.

At act 1812, a data storage layer is formed over the bottom electrode layer. FIG. 10 illustrates a cross-sectional view 1000 of some embodiments corresponding to act 1812.

At act 1814, a first top electrode layer having a first corrosion potential is formed onto the data storage layer. FIG. 10 illustrates a cross-sectional view 1000 of some embodiments corresponding to act 1814.

At act 1816, a second top electrode layer having a second corrosion potential is formed onto the first top electrode layer. The second corrosion potential is larger than the first corrosion potential. FIG. 10 illustrates a cross-sectional view 1000 of some embodiments corresponding to act 1816.

At act 1818, a first patterning process is performed on the first top electrode layer and the second top electrode layer to define a multi-layer top electrode. FIG. 11 illustrates a cross-sectional view 1100 of some embodiments corresponding to act 1818.

At act 1820, one or more sidewall spacers are formed along opposing sides of the multi-layer top electrode. FIG. 13 illustrates a cross-sectional view 1300 of some embodiments corresponding to act 1820.

At act 1822, a second patterning process is performed on the data storage layer and the bottom electrode layer. The second patterning process defines a data storage structure and a bottom electrode of the memory device. FIG. 14 illustrates a cross-sectional view 1400 of some embodiments corresponding to act 1822.

At act 1824, an upper ILD layer is formed over the memory device. FIG. 15 illustrates a cross-sectional view 1500 of some embodiments corresponding to act 1824.

At act 1826, a third patterning process is performed on the upper ILD layer to define a top electrode via hole exposing an upper surface of the second top electrode layer. FIG. 16 illustrates a cross-sectional view 1600 of some embodiments corresponding to act 1826.

At act 1828, the top electrode via hole is filled with a conductive material to define a top electrode via. FIG. 17 illustrates a cross-sectional view 1700 of some embodiments corresponding to act 1828.

Accordingly, in some embodiments, the present disclosure relates to a memory device (e.g., an RRAM device) having a multi-layer top electrode layer configured to mitigate formation of an oxide between the multi-layer top electrode layer and an overlying top electrode via.

In some embodiments, the present disclosure relates to a memory device. The memory device includes a bottom electrode disposed over a lower interconnect within a lower inter-level dielectric (ILD) layer over a substrate; a data storage structure disposed over the bottom electrode; a first top electrode layer disposed over the data storage structure; a second top electrode layer on the first top electrode layer, the second top electrode layer being less susceptible to oxidation than the first top electrode layer; and a top electrode via over and electrically coupled to the second top electrode layer. In some embodiments, the top electrode via extends from over a top surface of the second top electrode layer to below the top surface of the second top electrode layer; and the top electrode via is separated from the first top electrode layer by the second top electrode layer. In some embodiments, the memory device includes a top electrode oxide disposed between the top electrode via and the second top electrode layer. In some embodiments, the memory device includes a first oxide disposed along one or more sidewalls of the first top electrode layer, the first oxide having a greater thickness than the top electrode oxide. In some embodiments, the second top electrode layer includes titanium nitride, ruthenium, tungsten, tin, zirconium, aluminum nitride, silver, strontium, thallium, vanadium, zirconium nitride, or hafnium nitride. In some embodiments, the first top electrode layer includes tantalum and the second top electrode layer includes titanium nitride. In some embodiments, the second top electrode layer has a thickness in a range of between approximately 20 Angstroms (Å) and approximately 300 Å. In some embodiments, the second top electrode layer has a corrosion potential of greater than or equal to approximately −0.4V. In some embodiments, the second top electrode layer has a boiling point in a fluorine gas of greater than approximately 1500° C. In some embodiments, the second top electrode layer includes a material that utilizes a Gibbs free energy of greater than −600 kJ/mol to form an oxide. In some embodiments, the second top electrode layer has a first non-zero thickness directly below the top electrode via and a second thickness outside of the top electrode via, the second thickness greater than the first non-zero thickness.

In other embodiments, the present disclosure relates to an integrated chip. The integrated chip includes a memory device disposed over a substrate, the memory device having a data storage structure disposed between a bottom electrode and a multi-layer top electrode; a top electrode via disposed over and electrically coupled to the multi-layer top electrode; the multi-layer top electrode includes a first top electrode layer disposed over the data storage structure, and a second top electrode layer on the first top electrode layer and having a different material than the first top electrode layer; and the second top electrode layer having a larger corrosion potential than the first top electrode layer. In some embodiments, the integrated chip further includes a hard mask layer disposed over the second top electrode layer and having a first thickness, the top electrode via extending through the hard mask layer to a first bottom surface that is between sidewalls of the second top electrode layer and separated from the first top electrode layer by the second top electrode layer. In some embodiments, the integrated chip further includes a second memory device disposed over the substrate and having a second data storage structure disposed between a second bottom electrode and a second multi-layer top electrode, the second multi-layer top electrode including a fourth top electrode layer that is separated from the second data storage structure by a third top electrode layer that has a smaller corrosion potential than the fourth top electrode layer; a second top electrode via disposed over and electrically coupled to the second multi-layer top electrode; and a second hard mask layer disposed over the fourth top electrode layer and having a second thickness that is larger than the first thickness, the second top electrode via extending through the second hard mask layer to a second bottom surface that is separated from the third top electrode layer by the fourth top electrode layer.

In yet other embodiments, the present disclosure relates to a method of forming a memory device. The method includes forming a data storage layer on a bottom electrode layer over a substrate; forming a first top electrode layer over the data storage layer and a second top electrode layer over the first top electrode layer, the first top electrode layer having a smaller corrosion potential than the second top electrode layer; performing a first patterning process on the first top electrode layer and the second top electrode layer to define a multi-layer top electrode; and performing a second patterning process on the data storage layer and the bottom electrode layer to define a data storage structure and a bottom electrode. In some embodiments, the method further includes forming an upper inter-level dielectric (ILD) layer over the multi-layer top electrode; etching the upper ILD layer to form a top electrode via hole extending to the second top electrode layer; and forming a top electrode via within the top electrode via hole. In some embodiments, the method further includes etching the upper ILD layer using an etchant having a fluorine gas. In some embodiments, the second top electrode layer has a corrosion potential of greater than or equal to approximately −0.4V. In some embodiments, the first top electrode layer has a greater thickness than the second top electrode layer. In some embodiments, the method further includes exposing the first top electrode layer and the second top electrode layer to an ambient environment, the ambient environment forms a first oxide along sides of the first top electrode layer and a second oxide along sides of the second top electrode layer; and the first oxide has a greater thickness than the second oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode disposed over a lower interconnect within a lower inter-level dielectric (ILD) layer over a substrate;
   a data storage structure disposed over the bottom electrode;
   a first top electrode layer disposed over the data storage structure;
   a second top electrode layer on the first top electrode layer, wherein the second top electrode layer is less susceptible to oxidation than the first top electrode layer;
   a top electrode via over and electrically coupled to the second top electrode layer, wherein the top electrode via extends from over a top surface of the second top electrode layer to below the top surface of the second top electrode layer; and
   wherein the top electrode via is separated from the first top electrode layer by the second top electrode layer and wherein the second top electrode layer has a first non-zero thickness directly below the top electrode via and a second thickness outside of the top electrode via, the second thickness greater than the first non-zero thickness.

2. The memory device of claim 1, further comprising:
   a top electrode oxide disposed between the top electrode via and the second top electrode layer.

3. The memory device of claim 2, further comprising:
   a first oxide disposed along one or more sidewalls of the first top electrode layer, wherein the first oxide has a greater thickness than the top electrode oxide.

4. The memory device of claim 1, wherein the second top electrode layer comprises titanium nitride, ruthenium, tungsten, tin, zirconium, aluminum nitride, silver, strontium, thallium, vanadium, zirconium nitride, or hafnium nitride.

5. The memory device of claim 1, wherein the first top electrode layer comprises tantalum and the second top electrode layer comprises titanium nitride.

6. The memory device of claim 1, wherein the second top electrode layer has a thickness in a range of between approximately 20 Angstroms (Å) and approximately 300 Å.

7. The memory device of claim 1, wherein the second top electrode layer has a corrosion potential of greater than or equal to approximately −0.4V.

8. The memory device of claim 1, wherein the second top electrode layer has a boiling point in a fluorine gas of greater than approximately 1500° C.

9. The memory device of claim 1, wherein the second top electrode layer comprises a material that utilizes a Gibbs free energy of greater than −600 kJ/mol to form an oxide.

10. A memory device, comprising:
- a bottom electrode disposed over a substrate;
- a data storage structure disposed on the bottom electrode;
- a first top electrode layer disposed on the data storage structure;
- a second top electrode layer disposed on the first top electrode layer;
- a top electrode via disposed on the second top electrode layer, wherein the second top electrode layer is separated from the top electrode via by a top electrode oxide; and
- wherein the first top electrode layer comprises a first material that utilizes a first Gibbs free energy to form an oxide of the first material and the second top electrode layer comprises a second material that utilizes a second Gibbs free energy to form an oxide of the second material, the second Gibbs free energy being larger than the first Gibbs free energy.

11. The memory device of claim 10, wherein the second Gibbs free energy is greater than −600 kJ/mol.

12. The memory device of claim 10, wherein the top electrode via extends to a non-zero distance below a top of the second top electrode layer.

13. The memory device of claim 10, wherein the first top electrode layer is separated from the top electrode via by the second top electrode layer.

14. The memory device of claim 10, wherein a first oxide is arranged along outer edges of the first top electrode layer and a second oxide is arranged along outer edges of the second top electrode layer, the first oxide having a greater thickness than the second oxide.

15. A memory device, comprising:
- a bottom electrode disposed over a lower interconnect within a lower inter-level dielectric (ILD) layer over a substrate;
- a data storage structure disposed over the bottom electrode;
- a first top electrode layer disposed over the data storage structure;
- a second top electrode layer on the first top electrode layer, wherein the second top electrode layer is less susceptible to oxidation than the first top electrode layer and wherein the second top electrode layer has a thickness in a range of between approximately 20 Angstroms (Å) and approximately 300 Å;
- sidewall spacers arranged along opposing sides of the first top electrode layer and the second top electrode layer; and
- a top electrode via over and electrically coupled to the second top electrode layer.

16. The memory device of claim 15, wherein the second top electrode layer comprises titanium nitride, ruthenium, tungsten, tin, zirconium, aluminum nitride, silver, strontium, thallium, vanadium, zirconium nitride, or hafnium nitride.

17. The memory device of claim 15, wherein the top electrode via has a bottommost surface that is below a top of the second top electrode layer.

18. The memory device of claim 15, wherein the second top electrode layer comprises titanium nitride.

19. The memory device of claim 15, further comprising:
- a capping layer arranged between the data storage structure and the first top electrode layer.

20. The memory device of claim 15, wherein a first oxide is arranged along outer edges of the first top electrode layer and a second oxide is arranged along outer edges of the second top electrode layer, the first oxide having a greater thickness than the second oxide.

* * * * *